US010393833B2

(12) United States Patent
Wikus et al.

(10) Patent No.: US 10,393,833 B2
(45) Date of Patent: Aug. 27, 2019

(54) MAGNET ARRANGEMENT WITH FIELD-SHAPING ELEMENT FOR REDUCING THE RADIAL FIELD COMPONENT IN THE REGION OF AN HTS SECTION

(71) Applicant: Bruker BioSpin GmbH, Rheinstetten (DE)

(72) Inventors: Patrick Wikus, Nuerensdorf (CH); Volker Niemann, Ispringen (DE); Wolfgang Frantz, Karlsruhe (DE); Michael Dumm, Zurich (CH); Michael Wagenknecht, Zurich (CH)

(73) Assignee: BRUKER BIOSPIN GMBH, Rheinstetten (DE)

( * ) Notice: Subject to any disclaimer, the term of this patent is extended or adjusted under 35 U.S.C. 154(b) by 138 days.

(21) Appl. No.: 15/593,982

(22) Filed: May 12, 2017

(65) Prior Publication Data
US 2017/0343629 A1    Nov. 30, 2017

(30) Foreign Application Priority Data

May 12, 2016    (DE) .................. 10 2016 208 225

(51) Int. Cl.
*G01R 33/3815*    (2006.01)
*H01B 12/06*    (2006.01)
(Continued)

(52) U.S. Cl.
CPC ..... *G01R 33/3815* (2013.01); *G01R 33/3415* (2013.01); *G01R 33/3873* (2013.01);
(Continued)

(58) Field of Classification Search
CPC . G01R 33/3815; G01R 33/3415; H01F 6/065; H01F 6/06; H01B 12/06
See application file for complete search history.

(56) References Cited

U.S. PATENT DOCUMENTS 5,557,155 A * 9/1996 Hull .................. F16C 32/0438
310/90.5
5,659,227 A    8/1997 Ushiro et al.
(Continued)

FOREIGN PATENT DOCUMENTS

DE        10260728 A1    8/2004
DE    102012215507 B3    12/2013
(Continued)

OTHER PUBLICATIONS

Pitel et al., "Compensation of the radial magnetic field component of solenoids wound with anisotropic Bi(2223)Ag tape", Supercond. Sci. Technol. 10, 1997, pp. 847-852.
(Continued)

*Primary Examiner* — Huy Q Phan
*Assistant Examiner* — Zannatul Ferdous
(74) *Attorney, Agent, or Firm* — Edell, Shapiro & Finnan, LLC

(57) ABSTRACT

A superconducting magnet coil arrangement has a high-temperature superconductor (HTS) coil section (1*a*,1*b*,1*c*) in the form of a solenoid that is wound with an HTS tape conductor, and also has a field-shaping device comprising at least two field-shaping elements (2*a*,2*b*,2*c*). At least one respective field-shaping element is arranged adjoining each of the two axial ends of the HTS coil section, the field-shaping elements being configured in such a way that they reduce the field angle of the magnetic field generated by the magnet coil arrangement with respect to the axial direction in the region of the HTS coil section by at least 1.5°.

18 Claims, 4 Drawing Sheets

(51) Int. Cl.
*G01R 33/3873* (2006.01)
*H01F 6/06* (2006.01)
*G01R 33/3415* (2006.01)

(52) U.S. Cl.
CPC ............... *H01B 12/06* (2013.01); *H01F 6/06* (2013.01); *H01F 6/065* (2013.01)

(56) References Cited

U.S. PATENT DOCUMENTS

| | | | | |
|---|---|---|---|---|
| 5,747,426 | A * | 5/1998 | Abboud | F16C 32/0438 505/166 |
| 7,215,230 | B2 | 5/2007 | Niemann et al. | |
| 2004/0108924 | A1 * | 6/2004 | Schlenga | H01F 6/065 335/216 |
| 2006/0291112 | A1 * | 12/2006 | Markiewicz | H01F 6/02 361/19 |
| 2011/0080165 | A1 * | 4/2011 | Saito | G01R 15/205 324/252 |
| 2014/0066312 | A1 | 3/2014 | Kasten | |
| 2016/0216347 | A1 | 7/2016 | Roth et al. | |

FOREIGN PATENT DOCUMENTS

| | | |
|---|---|---|
| DE | 102013220142 A1 | 4/2015 |
| JP | H07142245 A | 6/1995 |
| JP | 2001264402 A | 9/2001 |
| JP | 2003158009 A | 5/2003 |
| JP | 201468001 A | 4/2014 |
| WO | 9608830 A2 | 3/1996 |

OTHER PUBLICATIONS

Polak et al., "Effect of Ferromagnetic Rings on Critical Current and AC Losses of a Coil Made From Bi-223/Ag Tape", IEEE Transactions on Applied Superconductivity, vol. 12, No. 1, Mar. 2002, 4 pages.

Weijers et al., "Effects of conductor anisotropy on the design of Bi—Sr—Ca—Cu—O sections of 25 T Solenoids", Supercond. Sci. Technol. 16, 2003, pp. 672-681.

Noguchi et al., "An optimal design method for SMES coils using HTS taples", IEEE Transactions on Applied Superconductivity, vol. 12, No. 1, Mar. 2002, 4 pages.

* cited by examiner

PRIOR ART

PRIOR ART

MAGNET ARRANGEMENT WITH FIELD-SHAPING ELEMENT FOR REDUCING THE RADIAL FIELD COMPONENT IN THE REGION OF AN HTS SECTION

CROSS REFERENCE TO RELATED APPLICATIONS

This application claims foreign priority under 35 U.S.C. § 119(a)-(d) to German Application No. 10 2016 208 225.6, filed on May 12, 2016, the entire contents of which are hereby incorporated by reference.

FIELD OF THE INVENTION

The invention relates to a superconductive magnet coil arrangement extending in an axial direction and having at least one coil section in the form of a solenoid and that is wound with a high-temperature superconductor (HTS) tape conductor, and also having a field-shaping device comprising at least two field-shaping elements.

BACKGROUND

Superconducting nuclear magnetic resonance (NMR) magnets are usually produced from NbTi or Nb3Sn wires. Because of limitations imposed by the critical magnetic field of Nb3Sn, there is at present an upper limit of approximately 23.5 Tesla (T) for the maximum achievable field strength. This corresponds in NMR to a proton resonance frequency of 1000 MHz.

To achieve higher field strengths and/or to be able to make a magnet of a given field strength more compact, it is necessary to revert to alternative conductor materials. Research in this connection is currently mainly focused on the use of HTS tape conductors (for example ReBCO, BSCCO or iron pnictides). The magnet, however, is not produced completely from HTS materials. Rather, for reasons of cost, it is advantageous to use HTS material only for the innermost sections, and to produce the background magnet by conventional "low-temperature superconductor" (LTS) technology (that is to say with NbTi and/or Nb3Sn).

Usually, a magnet section is wound from HTS tape material, and then connected in series with an LTS background magnet. The current carrying capacity of HTS tape conductors (or their "critical current" $I_C$) depends not only on the strength of the magnetic field in which the conductor is located but also on the orientation of the field. If the field lines run parallel to the surface of the tape, the critical current $I_C$ is high; if the field lines run at an angle to the surface of the tape, $I_C$ drops with increasing angle.

In an NMR magnet, which is generally constructed from coil sections in the form of solenoids, the field lines at the center of the coil sections run parallel to the axis of the magnet. Toward the periphery of the coil sections in the form of solenoids, the radial component of the field increases (see FIG. 3A). Here, the $I_C$ capacity utilization of the HTS conductor is accordingly at the greatest.

The current leads to the HTS section must likewise be routed through a region in which high radial field components prevail. The routing of the conductor typically takes place along a complexly shaped path, to ensure that the angle between the HTS tape and the field line is minimal. DE 102 60 728 A1 presents a method for the ideal routing of an HTS tape conductor, as it is led out from a coil winding in a predetermined path. The underlying problem here is that the HTS tape is exposed to a curved field.

DE 10 2013 220 142 A1 discloses a conventional magnet arrangement with an HTS tape conductor and an LTS wire, which are connected electrically in series by a joint. The HTS coil forms the inner section of the coaxially arranged coils. The joint is located outside the parallel B0 field, where the magnetic field has a significantly radial component. Because of the geometry of the HTS tape conductor, the routing of the HTS tape is adapted to the local angle of the magnetic field, so that the tape plane and the field lines are aligned parallel to one another and the current carrying capacity of the HTS tape is optimized. However, here it is not discussed, or even shown, to what extent the B0 field at the peripheral regions of the solenoid winding can be influenced in order to minimize a radial component on the HTS tape conductor.

JP 2001-264402 A discloses a superconducting magnet arrangement that is likewise constructed from a number of coaxially arranged solenoid magnets. The inner coil is produced from an HTS material. The magnet is constructed in this manner to provide a magnetic field that is particularly homogeneous. For this, so-called correction coils of superconducting material are arranged outside the main coil sections, for the purpose of homogenizing the field. However, this document does not address the problem in the peripheral region of the HTS tape conductor. This is also evident from the fact that the correction coils are not arranged in the peripheral region. Furthermore, here the correction coils lie so far to the outside that they are not particularly efficient.

The solutions that are being used at present in the prior art have several disadvantages:
- The $I_C$ requirement imposed on the conductor is determined by the parts of the HTS section that are exposed to great radial field components (usually at the periphery of the HTS section formed as a solenoid—that is, where the conductor is used to the greatest extent of its capacity). The resultant high requirements have an adverse effect on the price of the conductor and its commercial availability.
- The routing of the conductor from and to the wound package takes place along a complexly shaped path (see for instance DE 102 60 728 A1), which is laborious and space-intensive.
- In the regions of the HTS section that are exposed to great radial field components, so-called "screening currents" form in the HTS tape conductors, and for their part influence the magnetic field and cause inhomogeneities (that are highly undesired in particular in the case of NMR).

SUMMARY

Against this background, objects of the present invention include modifying a superconductive magnet coil arrangement of the type described above, and also modifying a method for the design thereof with generally available technologies. Further, these should be as simple as possible to implement, in a manner such that the restrictions discussed above of such superconductive magnet coil arrangements, which typically occur at the axial ends of the HTS section, are significantly mitigated or as far as possible avoided completely. It is a further object to increase considerably the magnetic field strength that can be generated with the coil. Yet another object is to form the magnet coil arrangement particularly compactly.

These objects are achieved in a surprisingly simple effective manner, and with readily available technical approaches, with a superconductive magnet coil arrangement of the type defined above which is characterized by at least one field-shaping element arranged adjoining each of the two axial ends of the HTS coil section, the field-shaping elements being configured such that they reduce the maximum field angle of the magnetic field generated by the magnet coil arrangement with respect to the axial direction in the region of the HTS coil section by at least 1.5°.

Under some circumstances, the current carrying capacity of coils that are wound from an anisotropic superconductor is limited at the axial ends by the magnetic field component in the radial direction. The present invention proposes a superconductive magnet coil arrangement with specially configured field-shaping elements, which make it possible to increase the current carrying capacity of the coil.

The current carrying capacity of the superconductor at the axial ends of the coil is increased by field-shaping elements that decisively reduce the field angle of the magnetic field with respect to the axial direction in the region of the HTS section being arranged axially above and below the HTS coil formed as a solenoid.

As a result, the radial field component that acts on the HTS tape conductor is reduced. This has several advantages:
a. The critical current of an HTS tape depends not only on the temperature and the field, but also on the field angle. If the field angle becomes smaller, the critical current increases (see FIG. 3B). This allows either stronger magnets to be built or less costly conductor materials to be used.
b. The radial field component generates screening currents in the HTS, which in turn have a undesired effect on the field in the sample volume and cause inhomogeneities. With the aid of the invention, these additional field inhomogeneities can be avoided.
c. A further advantage of the arrangement according to the invention is the more uniform distribution of the current carrying capacity of the superconductor in the coil as a whole. As a result, the superconductor is utilized better for the current flow; the coil can be operated with a higher current. The required quality of the HTS conductor (in particular with regard to $I_C$) and/or the required amount, and consequently the production costs, are consequently lower than in the case of comparable conventional arrangements. On the other hand, a higher magnetic field can be generated in the center of the coil with the same superconductor quality and/or amount.

All of this can be achieved according to the invention by suitably formed field-shaping elements of a magnetic material. The field-shaping elements may, however, also be windings of LTS material. The magnet as a whole can then be structurally designed so that such LTS field-shaping windings lie in a region in which the radial field component is high, even though the absolute field amount is below the critical field of the LTS conductor used.

In the region of the HTS section where the background field is so great that only HTS material can be used, the radial components remain small. Where the radial components of the background field become great, the field is small enough in terms of its absolute amount that it is possible to resort to LTS materials.

In the case of a first class of embodiments of the magnet coil arrangement according to the invention, the field-shaping device comprises field-shaping elements that are constructed from a magnetic material, in particular from ferromagnetic material such as iron. If the field-shaping elements are passive, that is to say, not current-carrying, they can be realized in a particularly simple and inexpensive way.

Particularly preferred are also embodiments in which the length ratio of the HTS coil section to a field-shaping element is between 2:1 and 5:1. Simulations have shown that this length ratio in high field magnets leads to a particularly efficient design.

Further advantageous embodiments of the magnet coil arrangement are distinguished by the fact that the HTS coil section is spatially separated from the field-shaping elements by one or more flanges, the thickness of which is preferably between 2 mm and 10 mm. The forces in the magnet act in such a way that solenoids are compressed along their axis ("axial pressure"). The flanges can absorb the forces with which the field-shaping elements are pressed towards the center, and thus act to relieve the HTS winding itself. Furthermore, the flanges additionally help if the field-forming elements are constructed from an LTS conductor, because they then form the delimitation for the winding chambers.

The maximum field strength at the magnetic center of the magnet coil arrangement is preferably at least 27 T. A field strength of 20 T corresponds approximately to a 850 MHz magnet. Because of the current market situation, the use of HTS tapes becomes profitable from around this frequency, in particular since, beginning at this frequency, it becomes possible to transfer magnet designs from 2K technology inexpensively to 4K technology. The present invention therefore contributes essentially to providing ultra-high field magnets that have not existed up to now. Such an ultra-high field magnet arrangement then comprises as its innermost coil an HTS tape conductor, to bring the B0 field to, for example, 1.2 GHz. A notable weakness of technologies that use HTS tape conductors has been the radial magnetic fields, which reduce the current carrying capacity. In order therefore to "straighten" these radial components, the invention proposes peripheral field-shaping elements, which are produced either from LTS material or from iron structures.

Most particularly preferred is a class of embodiments of the coil arrangement in which the field-shaping device comprises field-shaping elements that contain at least one LTS coil section wound with an LTS (low-temperature superconductor) wire. This is so because, with LTS wires, high current densities can be achieved without the field angle having a harmful influence on the critical current $I_C$. Particularly efficient field-shaping elements can be realized by LTS conductors with current flowing there-through.

Advantageous developments of this class of embodiments are characterized in that the LTS coil sections of the field-shaping device are electrically connected to the HTS coil sections, in particular connected in series, the HTS tape conductor and the LTS wire being connected to one another by a joint. If the LTS elements are electrically connected in series to the HTS elements, it is ensured that exactly the same current flows through these magnet sections. This rules out the possibility of different currents forming in the main coil and in the field-shaping elements, for example due to inductive effects. This helps in many ways, for example for maintaining long-term homogeneity, or with respect to the quench resistance.

In the case of preferred developments, the LTS wire contains an alloy with, in particular, the elements Nb and Sn. Nb3Sn is a very high-performance LTS superconductor, with which extremely high current densities can be achieved. It is only surpassed in this by HTS material.

Preferably, the field-shaping elements are arranged axially so close to the magnetic center of the magnet coil arrangement that the maximum local field strength to which the LTS wire is exposed during operation is 23.5 T. At 23.5 T, a reasonably high current density is still achieved with Nb3Sn. If the field-shaping elements are therefore used up to a maximum of 23.5 T, the properties of the LTS conductor are utilized ideally.

Also advantageous is a class of developments in which the field-shaping elements are arranged in a region in which the field angle of the magnetic field generated by the magnet coil arrangement is particularly great with respect to the axial direction of the magnetic field, in particular lies between 10° and 15°, but the absolute amount of the magnetic field in this region lies below the critical field of the LTS conductor material used. With field angles of between 10 and 15°, the current carrying capacity of HTS tape conductors already suffers noticeably. It is therefore very helpful if LTS material can be used instead of HTS material in this region.

Embodiments of the coil arrangement that have also proven successful in practice are those in which the ratio of the axial length of the LTS field-shaping elements to the axial length of the respectively adjacent HTS coil section is between 1:3 and 1:8, preferably approximately 1:5. Simulations have shown that this length ratio in high field magnets leads to a particularly efficient design.

Of great practical advantage are also embodiments in which the LTS field-shaping elements have approximately the same inside and outside diameters as the respective HTS coil section to which they adjoin. It is important in the magnet design to fill all of the existing volume with conductor through which current flows—voids tend to be inefficient from a design viewpoint. If, therefore, the LTS field-shaping elements and the HTS sections have the same diameter, it is possible for instance for LTS-HTS-LTS stacks to be easily fitted into one another or easily fitted into other coil sections without there being any voids.

In the case of further advantageous embodiments, there are at least two adjacently arranged stacks with alternating LTS-HTS-LTS conductors, the stacks being electrically connected to one another in such a way that there is a current conduction from a first LTS-HTS-LTS stack and then back through an adjacent LTS-HTS-LTS stack. Thus, the conductor routing in the magnet is particularly simple. It is usually ensured that, in a solenoid winding, the current inlet and outlet come to lie on the same side of the solenoid. In a normal winding, this is achieved by an even number of layers (2, 4, 6, etc.). In the case of a stack, this is specifically not possible. The current is therefore conducted downward within the stack, and must then be conducted upward again outside the stack. If two LTS-HTS-LTS stacks are installed, the current can be conducted in the first stack from the top downward, and in the second stack from the bottom upward. This is not standard practice. As explained above, usually the current input and output both lie on the upper side of a coil section. This simplifies the work in connecting the magnet sections to one another. If, however, an LTS-HTS-LTS stack is used, new advantages that offset the more complicated connection of the sections are obtained from such current conduction. To be specific: there is no need to be concerned about how current is conducted upward again out of the lower LTS package—a joint with an adjacent LTS-HTS-LTS stack is simply created and the current is conducted upward in this stack.

The scope of the present invention also covers a method for producing a magnet coil arrangement of the type described above which comprises the following method steps:

i) winding the field-shaping elements from LTS semifinished material containing a mixture of Nb and Sn, ii) reacting Nb and Sn to form the finished LTS wire by heating the wound LTS semifinished material to a temperature of >520° C., iii) soldering an inner end of the LTS wire of a first field-shaping element to the first end of the HTS tape conductor (see joint 4a in FIG. 2A), iv) winding the HTS coil section, and v) soldering the outer end of the LTS wire of the second field-shaping element to the outer end of the HTS tape conductor (see joint 4b in FIG. 2A).

An LTS-HTS-LTS stack can thus be produced in an amazingly simple way, Nb3Sn being used here as LTS material. With Nb3Sn, the difficulty is that the conductor has to be "reacted" at temperatures at which the HTS conductor is damaged. It was therefore necessary to find a method that allows the Nb3Sn conductor first to be wound and reacted, and only then the LTS conductor to be wound and electrically connected.

Another advantage of this method is that it leads to a coil design that has an increased current carrying capacity, and that the coil requires a lower superconductor quality or amount overall for operation with a given magnetic field strength than was required for the initial coil.

Finally, the scope of the present invention also covers a magnetic resonance spectrometer with a magnet coil arrangement of the type according to the invention described above.

BRIEF DESCRIPTION OF THE DRAWINGS

The invention is explained in more detail on the basis of exemplary embodiments and is represented in the drawings, in which.

DETAILED DESCRIPTION

To illustrate the operating mode of the present invention and also associated technical problems that can be overcome with the invention, first, the underlying physical principles are explained.

Figure 3A:
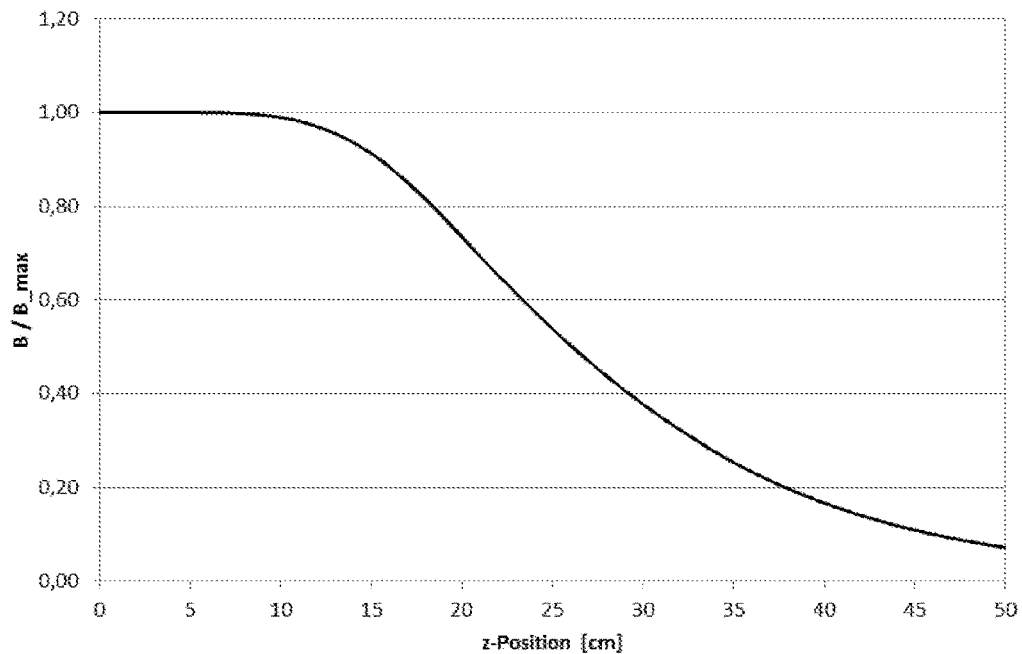
FIG. 3A shows the field profile along the z axis of a typical NMR high-field magnet according to the prior art with a coil length in the inner section by way of example of about 50 cm.

The field profile along the axial direction (z) of a typical NMR high field magnet according to the prior art, with a coil length in the inner section by way of example of about 50 cm is shown in FIG. 3A: outside the homogeneous plateau, the field falls sharply. Even at a position 25 cm above and below the magnetic center, the field has fallen to about half its maximum value. This means that, with a maximum field of 28 T at the magnetic center, the 80% value was 22.4 T, that is to say a value at which a customary Nb3Sn conductor still has a sufficient current carrying capacity.

Figure 3B:
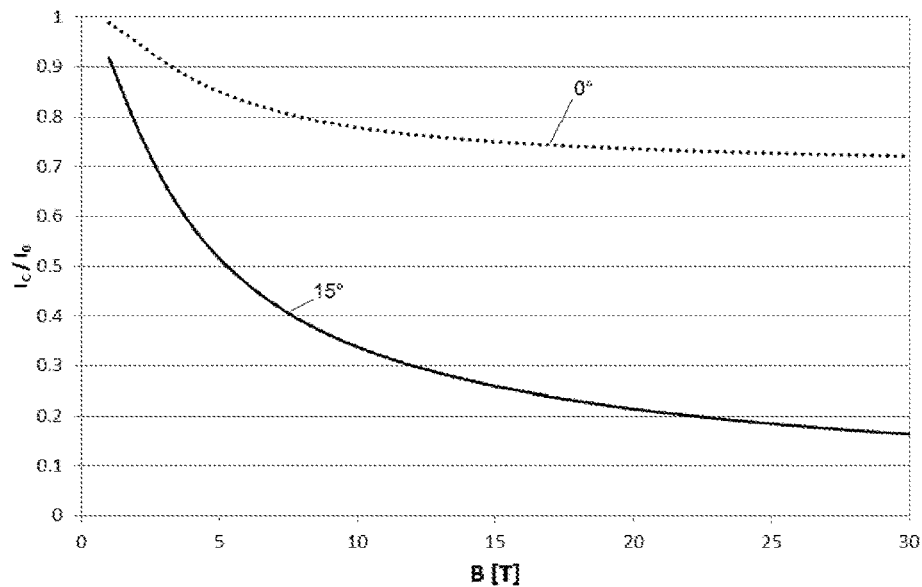
FIG. 3B shows the dependence of the critical current $I_C$ on the background field for the magnetic field angle 0° (field lines parallel to the HTS tape surface) and 15°, normalized to the maximum current carrying capacity of the tape $I_0$ at B=0 and an angle of 0°.

The dependence of the critical current $I_C$ on the background magnetic field is shown in FIG. 3B, for example, for two different field angles (15° and 0° field lines that run parallel to the HTS tape surface), normalized to the maximum current carrying capacity of the tape $I_0$ at B=0 and an angle of 0°.

Figure 3C:
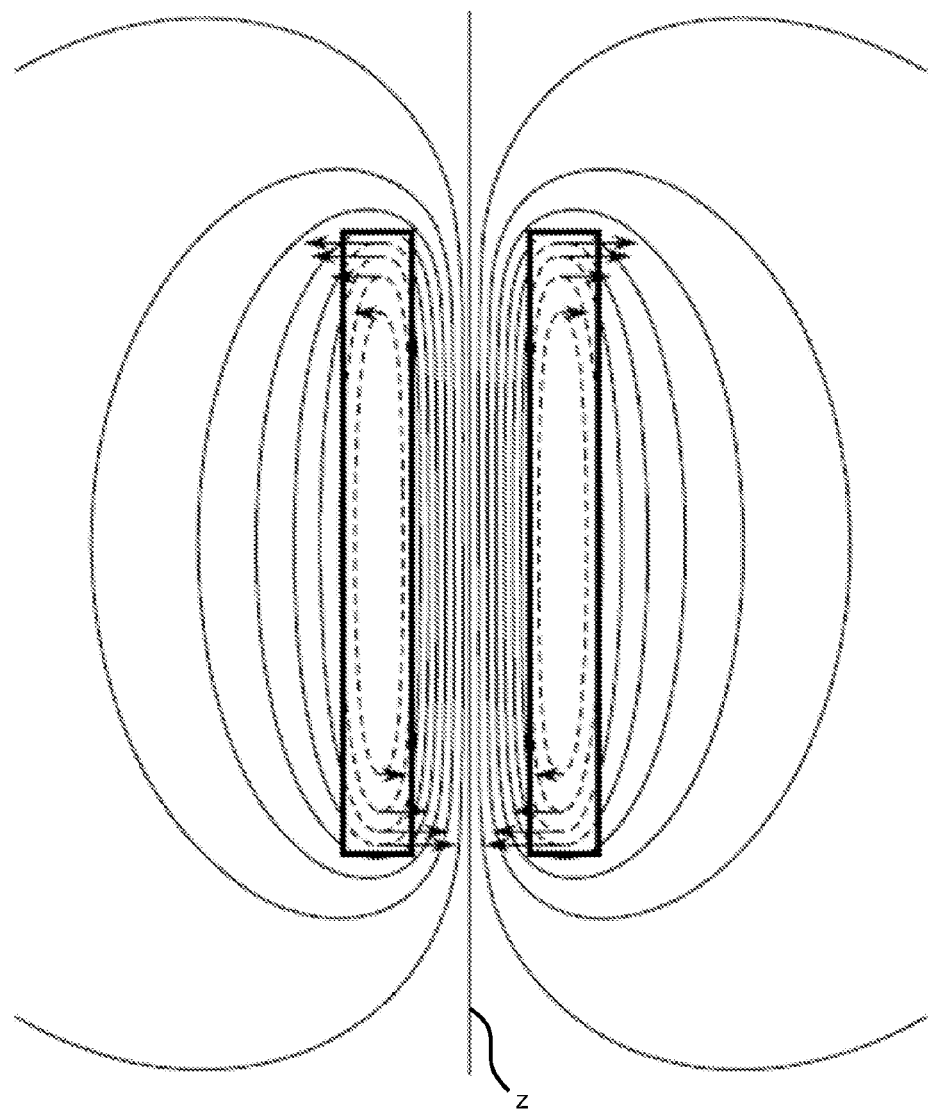
FIG. 3C shows the form of a field line by way of example in the case of a conventional magnet coil arrangement according to the prior art, the radial component of the field significantly increasing toward the peripheral region of the HTS section.

In FIG. 3C, the form of a field line in the case of a conventional magnet coil arrangement according to the prior art is shown by way of example, the radial component of the field increasing significantly toward the peripheral region of the HTS section. The magnet coil arrangement may have in its radially outer part with respect to the axial direction z one or more coil windings with a customary LTS wire, as a result of which the field line profile would change little. It can be seen well in FIG. 3C that the radial components of the field lines increase significantly in the peripheral region of the HTS coil.

Embodiments of the magnet coil arrangement according to the invention that are schematically shown in FIGS. 1A, 1B, 2A and 2B are likewise arranged in each case along an axial direction z and comprise at least one HTS coil section 1 (FIG. 1A); 1a, 1b, 1c (FIG. 1B) in the form of a solenoid. Also provided in each case is a field-shaping device comprising at least two field-shaping elements 2 (FIG. 1A); 2a, 2b, 2c (FIG. 1B), where the reference numerals "2," "2a," "2b," and "2c" each designate two field shaping elements, e.g., first/left and second/right field-shaping elements.

Figure 1A:
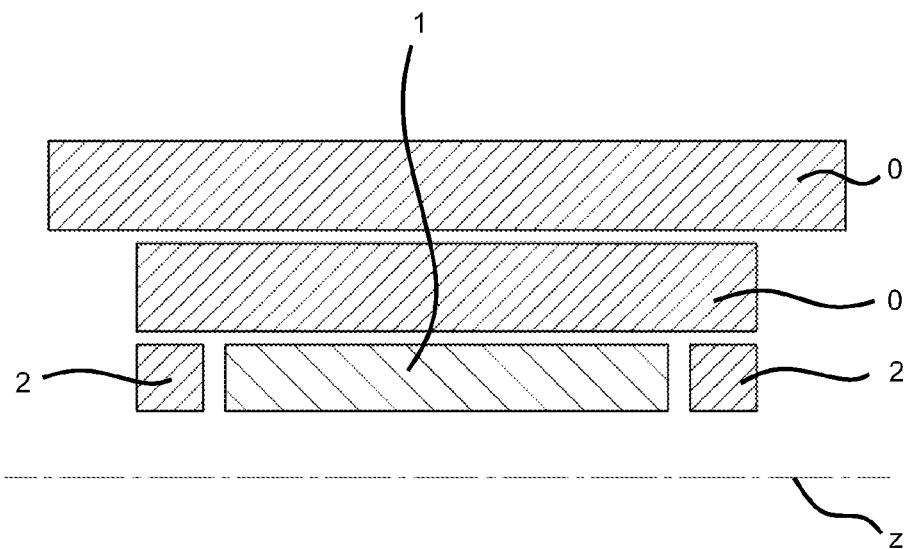
FIG. 1A shows a schematic sectional representation through a first embodiment of the magnet coil arrangement in a plane containing the axial direction with the relative geometrical arrangement of the coil regions (for reasons of symmetry only one half of the coil is shown)
Figure 1B:
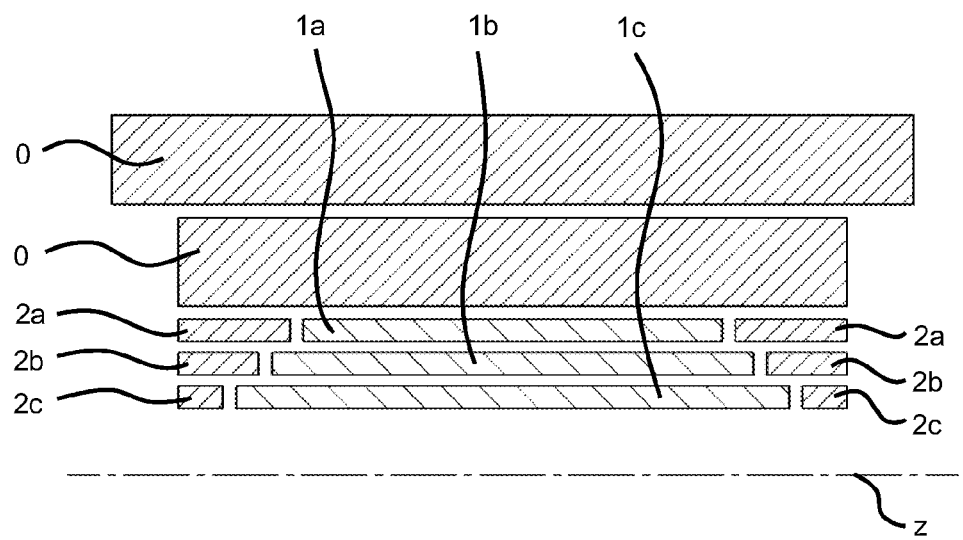
FIG. 1B shows a further embodiment of the magnet coil arrangement with a number of stacks following one another in the radial direction, which respectively extend in the axial direction alternately from a field-shaping element, an HTS coil section and a further field-shaping element.

The magnet coil arrangement is distinguished by the fact that at least one of the two field-shaping elements 2; 2a, 2b, 2c is arranged adjacent to and adjoining (e.g., via flanges) each of the two axial ends of the HTS coil section 1; 1a, 1b, 1c. For example, FIG. 1A shows left and right field-shaping elements 2 respectively adjacent left and right sides of HTS coil section 1. FIG. 1B shows left and right field shaping elements 2a respectively adjacent left and right sides of HTS coil section 1a, left and right field-shaping elements 2b respectively adjacent left and right sides of HTS coil section 1b, and so on. The field-shaping elements 2; 2a, 2b, 2c are configured in such a way that they reduce the field angle of the magnetic field generated by the magnet coil arrangement with respect to the axial direction in the region of the HTS coil section 1; 1a, 1b, 1c by at least 1.5°. In this case, the field-shaping elements 2; 2a, 2b, 2c may be constructed from a magnetic material, in particular from ferromagnetic material such as for instance iron, but also contain one or more LTS coil sections 2' that are wound with a low-temperature superconductor wire and electrically connected to the HTS coil sections 1; 1a, 1b, 1c in particular connected in series, the HTS tape conductor and the LTS wire in each case being connected to one another by a joint 4a, 4b. The HTS coil sections 1; 1a, 1b, 1c may be arranged spatially separated from the field-shaping elements 2; 2a, 2b, 2c in the axial direction by one or more flanges, such as flanges 3a, 3b.

While FIG. 1A shows a particularly simple embodiment of the magnet coil arrangement, in FIG. 1B there is shown a further embodiment, which has a number of units following one another in the radial direction, which respectively extend in the axial direction alternately from a field-shaping element 2a, 2b, 2c, an HTS coil section 1a, 1b, 1c and a further field-shaping element 2a, 2b, 2c. In the example of FIG. 1B, HTS coils sections 1a, 1b, and 1c are arranged as multiple, coaxially arranged, HTS coil sections of increasing radial diameter, and each of field-shaping elements 2a, 2b, 2c includes respective left and right field-shaping elements respectively adjacent left and right ends of a respective one of HTS coil sections 1a, 1b, and 1c.

Figure 2A:
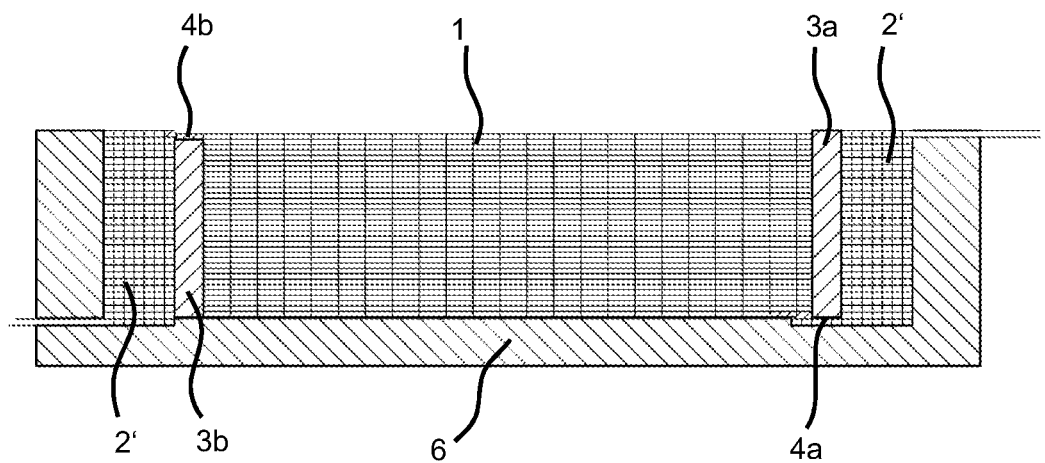
FIG. 2A shows a schematic sectional representation of a further embodiment of the magnet coil arrangement, the arrangement forming a stack comprising LTS-HTS-LTS conductors alternating in the axial direction.

FIG. 2A shows a further embodiment of the magnet coil arrangement, in which the HTS coil section 1 is wound up with the LTS field-shaping elements 2' that respectively adjoin one another in the axial direction, are spatially separated by flanges 3a, 3b but are electrically connected through joints 4a, 4b on a common coil support 6. The arrangement therefore forms a stack comprising LTS-HTS-LTS conductors alternating in the axial direction.

Figure 2B:
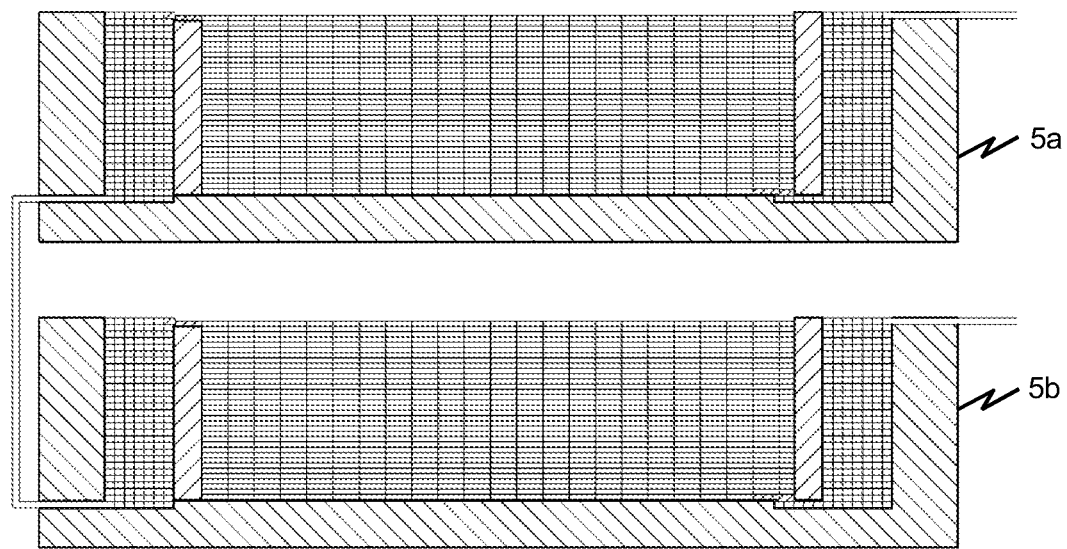
FIG. 2B shows an embodiment with two adjacently arranged, electrically interconnected stacks as shown in FIG. 2A.

In FIG. 2B, finally, there is shown an embodiment with two adjacently arranged, electrically interconnected stacks 5a, 5b, each of which has the same structure as the arrangement in FIG. 2A.

On the basis of the principles according to the invention described above, a large number of configurations are possible, for example also one in which the field-shaping coils are made longer where the field angles are higher (typically in the outer HTS section) and shorter where the background field is higher (typically in the inner HTS sections):

The HTS section may also be electrically connected directly to the LTS "field-shaping coils," so that the HTS current leads to the HTS section can be omitted.

Since the HTS section is exposed to very small radial field components, only very weak screening currents build up, and the homogeneity of the magnet improves.

The LTS material Nb3Sn, which is often used in magnet contruction, should be thermally treated after winding the conductor onto the coil support. This thermal treatment takes place at >520° C. Since HTS conductors cannot withstand such temperatures, the coil section should then be constructed such that first the Nb3Sn conductor can be wound onto the coil support 6, into the two chambers provided for this, after which the thermal treatment takes place. After the thermal treatment, the HTS conductor is wound onto the coil support, and may for example be connected to the Nb3Sn conductor.

It is also possible for a number of coil sections produced in this way to be interconnected to form a magnet system.

If Nb3Sn conductors are used for the field-shaping coils, the field-shaping coils are preferably drawn axially so far to the magnetic center that the maximum local field strength to which the Nb3Sn conductor is exposed is 22.5 T. This ensures that there is still a sufficiently high current carrying capacity in the Nb3Sn conductor. In the present example as shown in FIG. 3A, the distance of the field-shaping coil from the magnetic center would be approximately 17 cm.

The maximum field angle in this region, that is to say the radially innermost winding at the axially outer ends of the coil, typically lies—depending on the magnet design—between 5 and 15 degrees. The field-shaping elements allow the field angle in the HTS region to be reduced by typically 2 to 4 degrees, which reduces the current capacity utilization of the HTS conductor (I/Ic) by at least 20 percent. At the same time, the reduction of the screening currents has the effect of improving the homogeneity of the magnet by approximately 25%.

Typically, the field-shaping coils have approximately the same inside and outside diameters as the HTS wound package that they surround, since the aim is to use, to the greatest extent possible, the entire free volume for magnet windings in order to maximize the field strength. In the case of a UHF NMR magnet of the current generation, for a standard bore system the inside diameter of the HTS wound package is approximately 80 mm and the outside diameter approximately 160 mm, and for a wide bore system the inside diameter is approximately 115 mm and the outside diameter is approximately 180 mm.

The length ratio of a field-shaping element to the HTS coil in the inner section is approximately 1:5; the field-shaping elements of the outer sections may also be made longer, since the magnetic field is smaller there and consequently the LTS still has current carrying capacity.

As already mentioned above, the field-shaping coils and the HTS wound package may be spatially separated from one another in the axial direction by flanges $3a$, $3b$. A flange is a reinforcing disk running around and fixedly connected to the coil support 6. These flanges absorb at least partially the axial pressure directed toward the magnetic center that occurs in the Nb3Sn wound packages (typically between 5 and 15 MPa). It is normally endeavored to avoid as far as possible any pressure on the HTS winding. The flanges preferably have a thickness of between 2 and 10 mm. If the thickness is less than 2 mm, the flange is too weak to withstand the pressure of the field-shaping elements. If the flange is >10 mm, the gap between the windings is so great that magnetic field lines may be able to bend into the gap, whereby in turn radial field components may act on the HTS coil, which is also, in fact, to be avoided.

A possible disturbance of the homogeneity that is caused by the Nb3Sn coils (field-shaping elements), may be corrected by suitable formation of the notch or by shims of a ferromagnetic material. These possibilities of correction are known to persons skilled in the relevant art.

The radial field components that act on the HTS section(s) may also be reduced by making LTS sections 0 of the magnet sufficiently long. However, this has an adverse effect on the overall size, mass and the costs of the magnet. Alternatively, the HTS section may be made very short. However, then it contributes less to the B0 field, which makes the magnet inefficient. Furthermore, the homogenization of the magnet is made much more difficult.

Among the advantages of the arrangement according to the invention is the more uniform distribution of the current carrying capacity of the superconductor in the coil as a whole. As a result, the capacity of the superconductor is utilized better and the coil can be operated with a higher current. The required quality and amount of superconductor material, and consequently the material costs, are lower, or a higher magnetic field can be generated in the center of the coil with the same amount of superconductor material.

In principle, the present invention comes into consideration for all magnet systems with coils of HTS material. For a system with LTS coils as field-shaping elements, however, use is especially appropriate in the case of systems for which the operating temperature is chosen such that both HTS and LTS conductors can be used (T<10K).

In summary, in one aspect, an apparatus is provided comprising a superconducting magnet coil arrangement extending along an axial direction and having at least one coil section (e.g., 1; $1a$, $1b$, $1c$) formed as a solenoid that is wound with an HTS (high-temperature superconductor) tape conductor, and also having a field-shaping device comprising at least two field-shaping elements (e.g., 2; $2a$, $2b$, $2c$), characterized in that at least one of the field-shaping elements (e.g., 2; $2a$, $2b$, $2c$) is arranged adjoining each of the two axial ends of the HTS coil section (e.g., 1; $1a$, $1b$, $1c$), the field-shaping elements (e.g., 2; $2a$, $2b$, $2c$) being configured such that they reduce the maximum field angle of the magnetic field generated by the magnet coil arrangement with respect to the axial direction in the region of the FITS coil section (e.g., 1; $1a$, $1b$, $1c$) by at least 1.5°.

In another aspect, a superconducting magnet coil arrangement is provided comprising: a high-temperature superconductor (FITS) coil section (e.g., 1; $1a$, $1b$, $1c$) including a coil formed as a solenoid having an axis extending in an axial direction and that is wound with an HTS tape conductor, the FITS coil section having a first end and a second end spaced-apart in the axial direction; and a field shaping device including a first field-shaping element (e.g., 2; $2a$, $2b$, $2c$) and a second field shaping element (e.g., 2; $2a$, $2b$, $2c$) adjoining the first end and the second end of the FITS coil section, respectively, the first field-shaping element and the second field-shaping element configured to reduce a maximum field angle of a magnetic field generated by the magnet coil arrangement with respect to the axial direction in a region of the FITS coil section by at least 1.5° relative to the maximum field angle when the field-shaping device is absent.

In an example arrangement, the field-shaping elements may each include a respective low-temperature superconductor (LTS) coil section (2') wound with an LTS wire.

LIST OF DESIGNATIONS 0 radially outer magnet coil windings of LTS wire
1; $1a$; $1b$; $1c$ HTS coil section
2; $2a$; $2b$; $2c$ field-shaping elements
2' LTS coil section
$3a$, $3b$ flanges
$4a$, $4b$ joints
$5a$, $5b$ stacks
6 coil support
z axis of symmetry of the magnet coil arrangement

The invention claimed is:
1. A superconducting magnet coil arrangement extending in an axial direction and comprising:
  at least one high-temperature superconductor (HTS) coil section formed as a solenoid and wound with an HTS tape conductor, the HTS coil section having a first end and a second end spaced-apart from one another in the axial direction; and
  a field shaping device including a first field-shaping element and a second field-shaping element, each respectively adjacent the first end and the second end of the HTS coil section,
  wherein the first field-shaping element and the second field-shaping element are configured to reduce a maximum field angle of a magnetic field generated by the magnet coil arrangement with respect to the axial direction in a region of the HTS coil section by at least

1.5° in comparison with the maximum field angle when no such field-shaping device is present.

2. The superconducting magnet coil arrangement of claim 1, wherein the field-shaping elements each comprise a magnetic material.

3. The superconducting magnet coil arrangement of claim 2, wherein the magnetic material comprises iron or a ferromagetic material other than iron.

4. The superconducting magnet coil arrangement of claim 2, wherein a ratio of an axial length of the HTS coil section to an axial length of one of the field-shaping elements is between 2:1 and 5:1.

5. The superconducting magnet coil arrangement of claim 1, further comprising at least one flange having a thickness between 2 mm and 10 mm and configured to separate one of the field-shaping elements from one of the ends of the HTS coil section by the thickness.

6. The superconducting magnet coil arrangement of claim 1, wherein a maximum magnetic field strength at a magnetic center of the magnet coil arrangement is at least 27 Tesla.

7. The superconducting magnet coil arrangement of claim 1, wherein the field-shaping elements each include a respective low-temperature superconductor (LTS) coil section wound with an LTS wire.

8. The superconducting magnet coil arrangement of claim 7, wherein the LTS coil sections of the field-shaping device are electrically connected to respective HTS coil sections.

9. The superconducting magnet coil arrangement of claim 8, further comprising an electrically conducting joint configured to connect, in series, the LTS wire of the LTS coil section to the HTS tape conductor.

10. The superconducting magnet coil arrangement of claim 7, wherein the LTS wire comprises an alloy including Nb and Sn.

11. The superconducting magnet coil arrangement of claim 7, wherein the field-shaping elements are each arranged axially sufficiently close to a magnetic center of the magnet coil arrangement that a maximum local field strength to which the LTS wire is exposed during operation is 23.5 Tesla.

12. The superconducting magnet coil arrangement of claim 7, wherein the field shaping elements are arranged in a region in which a field angle of a magnetic field generated by the magnet coil arrangement with respect to an axial direction of the magnetic field is between 5° and 15°.

13. The superconducting magnet coil arrangement of claim 12, wherein an absolute magnitude of the magnetic field in the region is below a critical magnetic field of a material of the LTS wire.

14. The superconducting magnet coil arrangement of claim 7, wherein a ratio of an axial length of each field-shaping element to an axial length of the HTS coil section is between 1:3 and 1:8.

15. The superconducting magnet coil arrangement of claim 7, wherein each of the field-shaping elements has an inner diameter and an outer diameter approximately equal to an inner diameter and an outer diameter of a respective, adjoining HTS coil section.

16. The superconducting magnet coil arrangement of claim 7,
wherein the first field-shaping element, the HTS coil section, and the second field-shaping element together form a first stack comprising first alternating LTS-HTS-LTS conductors arranged along the axial direction,
wherein the magnetic coil arrangement further comprises a second stack comprising second alternating LTS-HTS-LTS conductors arranged along the axial direction and configured similarly to the first alternating LTS-HS-LTS conductors,
wherein the first stack and the second stack are situated adjacent one another and are electrically inter-connected, to enable current conduction from the first stack to the second stack.

17. A method of making a superconducting magnet coil arrangement extending in an axial direction, comprising:
at least one high-temperature superconductor (HTS) coil section in the form of a solenoid and that is wound with an HTS tape conductor, the HTS coil section having a first end and a second end spaced-apart from one another in the axial direction; and
a field shaping device including a first field-shaping element and a second field shaping element, each respectively adjacent the first end and the second end of the HTS coil section,
wherein the field-shaping element and the second field-shaping element each include a respective low-temperature superconductor (LTS) coil section wound with an LTS wire,
wherein the first field-shaping element and the second field-shaping element are configured to reduce a maximum field angle of a magnetic field generated by the magnet coil arrangement with respect to the axial direction in a region of the HTS coil section; and
wherein the method comprises:
winding each field-shaping element from LTS semi-finished material containing a mixture of Nb and Sn;
reacting the Nb and Sn to form a finished LTS wire by heating the wound LTS semi-finished material to a temperature of greater than 520° C.;
soldering an inner end of the LTS wire of the first field-shaping element to a first end of the HTS tape conductor;
winding the HTS coil section; and
soldering an outer end of the LTS wire of the second field-shaping element to an outer end of the HTS tape conductor.

18. A magnetic resonance spectrometer, comprising a superconducting magnet coil arrangement as claimed in claim 1.

* * * * *